(12) United States Patent
Zeller

(10) Patent No.: US 8,417,209 B2
(45) Date of Patent: Apr. 9, 2013

(54) IMAGE FREQUENCY REJECTION MIXER

(75) Inventor: Sebastian Zeller, Grassbrunn (DE)

(73) Assignee: STMicroelectronics Design and Application GmbH, Grassbrunn (DE)

( * ) Notice: Subject to any disclaimer, the term of this patent is extended or adjusted under 35 U.S.C. 154(b) by 700 days.

(21) Appl. No.: 12/609,359

(22) Filed: Oct. 30, 2009

(65) Prior Publication Data

US 2011/0105071 A1 May 5, 2011

(51) Int. Cl.
*H04B 1/00* (2006.01)
(52) U.S. Cl. .......................................... 455/302; 455/333
(58) Field of Classification Search .................. 455/323, 455/325, 326, 327, 330, 333, 334; 327/355, 327/357, 358, 359
See application file for complete search history.

(56) References Cited

U.S. PATENT DOCUMENTS

| | | | | |
|---|---|---|---|---|
| 7,852,135 | B2* | 12/2010 | Laaser | 455/323 |
| 2005/0064839 | A1* | 3/2005 | Smith et al. | 455/323 |
| 2008/0032661 | A1* | 2/2008 | Ojo et al. | 455/333 |

* cited by examiner

*Primary Examiner* — Thanh Le
(74) *Attorney, Agent, or Firm* — Seed IP Law Group PLLC

(57) ABSTRACT

An image frequency rejection mixer has a first differential transconductor that receives a differential mixer input signal, a second differential transconductor that receives the differential mixer input signal and cross-coupled to the first differential transconductor, a first mixing circuit that generates a first differential mixing circuit output signal by mixing a first differential information signal with a first local oscillation signal, a second mixing circuit that generates a second differential mixing circuit output signal by mixing a second differential information signal with a second local oscillation signal, with the first local oscillation signal and the second local oscillation signal being in quadrature, and an image rejection circuit that generates a differential mixer output signal from the first and second differential mixing circuit output signals.

18 Claims, 2 Drawing Sheets

US 8,417,209 B2

IMAGE FREQUENCY REJECTION MIXER

BACKGROUND

1. Technical Field

The present disclosure is directed to an image frequency rejection mixer and to a mixing stage of an image frequency rejection mixer

2. Description of the Related Art

Electronic mixers for translating a radio frequency signal to an intermediate frequency are well known in the art. Such mixers are for example used in AM and FM radio receivers, wherein a received radio signal is translated from a carrier frequency, i.e., the radio frequency, to an intermediate frequency for signal processing, such as amplifying and pass-band filtering, before another translation into the base band takes place for outputting an audio signal to the user.

The basic idea of said frequency translation stems from a multiplication of two trigonometric signals, as illustrated in the following equation:

$$V_{RF}(t) * V_{LO}(t) = V^*_{RF} \cos(2\pi f_{RF} t) * V^*_{LO} \cos(2\pi f_{LO} t)$$
$$= \tfrac{1}{2} V^*_{RF} V^*_{LO} \cos(2\pi (f_{RF} - f_{LO}) t) + \tfrac{1}{2} V^*_{RF} V^*_{LO} \cos(2\pi (f_{RF} + f_{LO}) t)$$

wherein $f_{RF}$ is the frequency of a received radio signal, $f_{LO}$ is the frequency of a local oscillation signal, and $V^*_{RF}$ and $V^*_{LO}$ are the amplitudes of the radio signal and the local oscillation signal, respectively. As is apparent from the first term of the right hand side of above equation, the intermediate frequency $f_{IF}$ is the difference between the desired radio frequency to be received $f_{RF,desired}$ and the local oscillation frequency. However, from basic trigonometric laws, it is known that $\cos(\alpha) = \cos(-\alpha)$. Therefore, there exists an undesired radio frequency $f_{RF,undesired}$ that is mixed to the same intermediate frequency, with said undesired radio frequency satisfying the condition $f_{RF,undesired} - f_{LO} = -f_{IF}$. This undesired radio frequency is also referred to as image frequency.

In order to solve this problem, complex mixers, so called image reject mixers, have been developed. These image reject mixers are comprised of two signal paths, with an input signal being multiplied with a first local oscillation signal in the first signal path and being multiplied with a second local oscillation signal in the second signal path. The first and the second local oscillation signals are in quadrature. For example, the two local oscillation signals may be a sin-signal and a cos-signal. With appropriate signal processing after the mixing operation, the two resulting mixed signals may be combined in a way that only the spectral component at the desired radio frequency is present in the mixer output intermediate frequency signal.

An example of a portion of such an image reject mixer is shown in FIG. 1. A mixer input signal is input at the image reject mixer inputs 10 and 12 of the mixing stage 1 of the image reject mixer. This differential input signal is amplified in the two transconductors 2 and 4, and the transconductor output signals are mixed in the mixing circuits 6 and 8, respectively. For these two mixing operations, a first local oscillation signal is supplied to the terminals 606 and 608, and a second local oscillation signal is supplied to the terminals 806 and 808. The mixing circuit output signals, present in differential form at the mixing circuit output terminals 618, 620 and 818, 820, are then post-processed in order to cancel the image frequency component at the mixer output.

Such a complex mixer has the advantage of rejecting the image frequency component of the received radio frequency signal. However, due to its complex layout, a lot of undesired electronic noise is generated. Such noise deteriorates the quality of the mixer output signal. Regarding the application of such a mixer to a radio receiver, the quality of the audio output presented to the user is reduced due to the electronic noise. It is equally valid to say that the electronic noise makes a higher signal-to-noise ratio at the receiver input necessary in order to still successfully recover the transmitted signal and output it to a user with a high quality.

Accordingly, it would be beneficial to provide an image frequency rejection mixer that reduces the electronic noise introduced in the signal processing path.

BRIEF SUMMARY

According to a first aspect of the present disclosure, an image frequency rejection mixer is provided that includes a first differential transconductor for receiving a differential mixer input signal, a second differential transconductor for receiving the differential mixer input signal, a first mixing circuit for generating a first differential mixing circuit output signal by mixing a first differential information signal with a first local oscillation signal, a second mixing circuit for generating a second differential mixing circuit output signal by mixing a second differential information signal with a second local oscillation signal, with the first local oscillation signal and the second local oscillation signal being in quadrature, and an image rejection circuit for generating a differential mixer output signal from the first and second differential mixing circuit output signals, wherein the first and the second differential transconductors are cross-coupled with the first and second mixing circuits.

Exemplary embodiments of the disclosure according to the first aspect allow for a significant reduction of the noise generated in the first and second differential transconductors and translated into the differential mixer output signal. The noise components introduced by the first and second differential transconductors are generally uncorrelated. The cross-coupling of the first and second differential transconductors with the first and second mixing circuits makes the noise components present at the inputs of the first and second mixing circuits and stemming from the inherent noise sources of the first and second differential transconductors correlated. Through the operation of the first and second mixing circuits, the portions of the noise components at the desired radio frequency and the undesired image frequency are mixed into the intermediate frequency. Due to the correlation of these noise components at the outputs of the first and second mixing circuits, the image rejection circuit cancels out one of these two noise side-bands in the course of the operation of cancelling the image frequency components of the received radio signal. Therefore, the noise power contributed to the intermediate frequency signal by the first and second differential transconductors is essentially halved as compared to the previous approach described above.

According to a second aspect of the present disclosure, a mixing stage of an image frequency rejection mixer is provided, which includes a first differential transconductor for receiving a differential mixer input signal, a second differential transconductor for receiving the differential mixer input signal, a first mixing circuit for generating a first differential mixing circuit output signal by mixing a first differential information signal with a first local oscillation signal, and a second mixing circuit for generating a second differential mixing circuit output signal by mixing a second differential information signal with a second local oscillation signal, with the first local oscillation signal and the second local oscillation signal being in quadrature, wherein the first and the second differential transconductors are cross-coupled with the first and second mixing circuits.

Exemplary embodiments of the disclosure according to the second aspect allow for the same advantages as discussed above with regard to image frequency rejection mixers according to the first aspect. Mixing stages having this feature combination allow for correlated noise components at the outputs of the first and second mixing circuits, such that a further circuit, provided in the signal path downstream of the mixing stage, is enabled to significantly reduce the noise introduced by the first and second differential transconductors via additional signal processing.

In accordance with another aspect of the present disclosure, a circuit is provided that includes a mixing stage that receives a differential mixer input signal and that includes cross-coupled first and second differential transconductor stages.

In accordance with another aspect of the foregoing circuit, the mixing stage includes a first mixing circuit that generates a first differential mixing circuit output signal by mixing a first differential information signal with a first local oscillation signal, the first mixing circuit including a first and a second mixing circuit input terminal; and a second mixing circuit that generates a second differential mixing circuit output signal by mixing a second differential information signal with a second local oscillation signal, with the first local oscillation signal and the second local oscillation signal being in quadrature, the second mixing circuit comprising a third and a fourth mixing circuit input terminal.

In accordance with another aspect of the foregoing circuit, the first differential transconductor includes a first and second transconductor output terminal and the second differential transconductor comprises a third and a fourth transconductor output terminal.

In accordance with another aspect of the foregoing circuit, the first transconductor output terminal is coupled to the first mixing circuit input terminal, the second transconductor output terminal is coupled to the fourth mixing circuit input terminal, the third transconductor output terminal is coupled to the third mixing circuit input terminal, and the fourth transconductor output terminal is coupled to the second mixing circuit input terminal.

In accordance with another aspect of the foregoing circuit, an image rejection circuit is provided that generates a differential mixer output signal from the first and second differential mixing circuit output signals.

BRIEF DESCRIPTION OF THE SEVERAL VIEWS OF THE DRAWINGS

Embodiments of the disclosure are described in greater detail below with reference to the figures, wherein.

Figure 1:
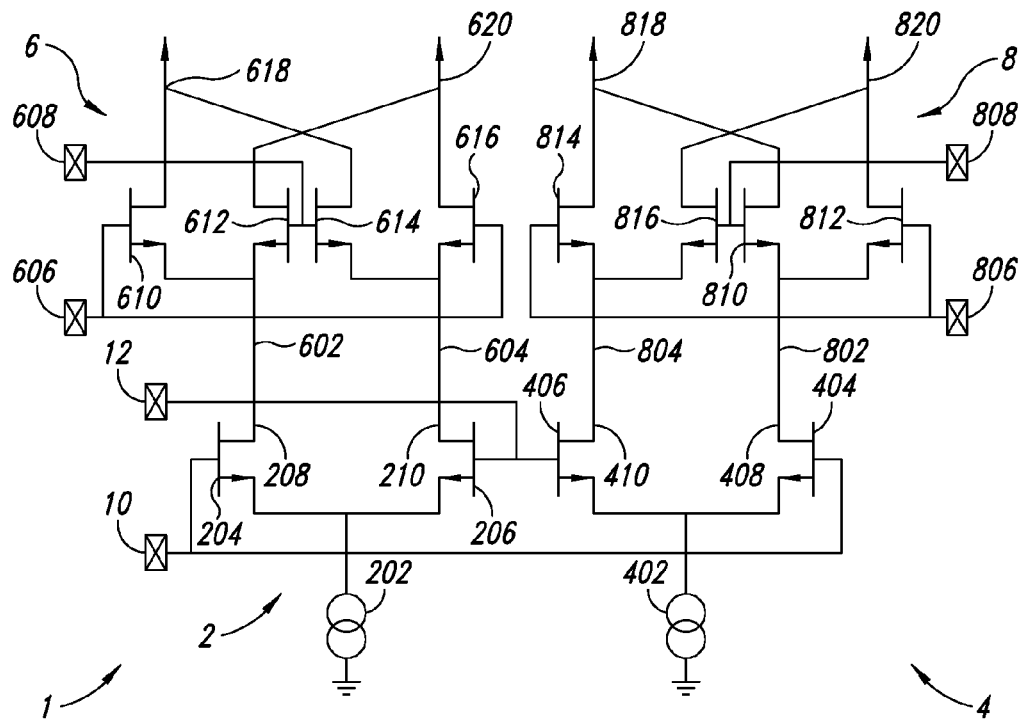
FIG. 1 shows a schematic diagram of a previous approach mixing stage of an image frequency rejection mixer.

According elements are denoted with according reference numerals throughout the figures.

DETAILED DESCRIPTION

Figure 2:
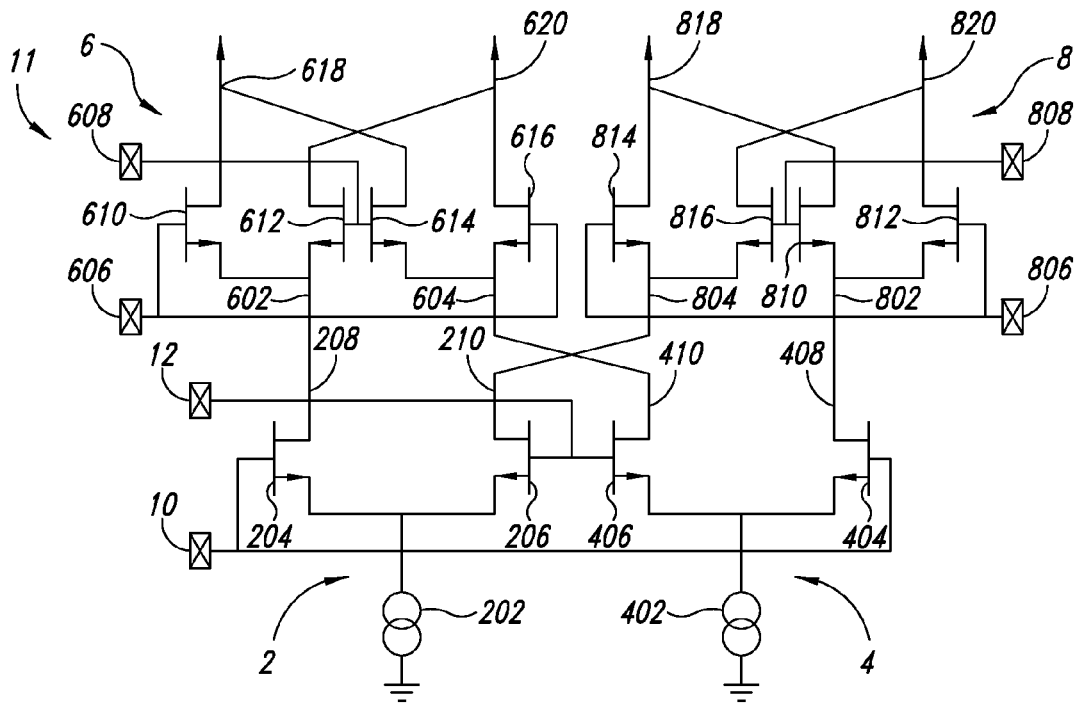
FIG. 2 shows a schematic diagram of a mixing stage of an image frequency rejection mixer according to an exemplary embodiment of the present disclosure.

FIG. 2 shows a schematic circuit representation of an exemplary embodiment of a mixing stage of an image frequency rejection mixer in accordance with an aspect of the present disclosure. Herein, the term mixing stage refers to a combination of a transconducting sub-stage and a mixing operation sub-stage in the current domain. Accordingly, a differential mixer input voltage is converted to the current domain, wherein the mixing operation takes place.

The mixing stage 11 includes a first differential transconductor 2 and a second differential transconductor 4. The first differential transconductor 2 is comprised of two MOSFETs 204 and 206, whose control terminals, i.e., the gate terminals, are connected to the input terminals 10 and 12 of the mixer. The controlled paths through the transistors 204 and 206 connect the first transconductor output terminal 208 and the second transconductor output terminal 210 to a bias current source 202, respectively. The second differential transconductor 4 has the same circuit structure as the first differential transconductor 2. The gate terminals of the transistors 404 and 406 are coupled to the mixer input terminals 10 and 12, respectively. The third and fourth transconductor output terminal 408 and 410 are connected to the second current bias source 402 via the MOSFET channels in the transistors 404 and 406, respectively.

The mixing stage 11 further includes a first mixing circuit 6 and a second mixing circuit 8. These mixing circuits are also referred to as Gilbert mixers, with the term Gilbert mixers denoting a class of mixers that carry out the mixing operation in the current domain. The first mixing circuit 6 has a first mixing circuit input terminal 602 and a second mixing circuit input terminal 604 as well as a first mixing circuit output terminal 618 and a second mixing circuit output terminal 620. The first mixing circuit input terminal 602 is coupled to the first mixing circuit output terminal 618 via the controlled signal path of the first mixing circuit transistor 610. The first mixing circuit input terminal 602 is further coupled to the second mixing circuit output terminal 620 via the controlled signal path of the second mixing circuit transistor 612. The second mixing circuit input terminal 604 is coupled to the first mixing circuit output terminal via the controlled signal path of the third mixing circuit transistor 614. The second mixing circuit input terminal 604 is further coupled to the second mixing circuit output terminal 620 via the controlled signal path of the fourth mixing circuit transistor 616. The controlled signal paths of the first to fourth mixing circuit transistors are the channels of MOSFETs 610, 612, 614, and 616 in the embodiment depicted in FIG. 2. With the mixing operation taking place in the current domain, the joining of the outputs of the first switching circuit transistor 610 and the third switching circuit transistor 614 represents an adding operation to yield the signal at the first mixing circuit output terminal 618. This equally applies to the outputs of the second mixing circuit transistor 612 and the fourth mixing circuit transistor 616 yielding the signal at the second mixing circuit output terminal 620 through addition. The control terminals, which are MOSFET gates in the exemplary embodiment of FIG. 2, of the first to fourth mixing circuit transistors are controlled by a first local oscillation signal applied to the first and second local oscillation terminals 606 and 608. The signal portion supplied to the first local oscillation terminal 606 controls the first mixing circuit transistor 610 and the fourth mixing circuit transistor 616. The signal portion supplied to the second local oscillation terminal 608 controls the second mixing circuit transistor 612 and the third mixing circuit transistor 614.

In the embodiment of FIG. 2, the local oscillation signal supplied to the first and second local oscillation terminal is a square wave signal having a local oscillation frequency $f_{LO}$. Accordingly, during half of the wavelength, the first differential information signal, present at the first and second mixing circuit input terminals 602 and 604, is switched to the first and second mixing circuit output terminals 618 and 620 through the first and fourth mixing circuit transistors 610 and 616. During the other half of a wavelength, the first differential information signal is switched to the second and first mixing circuit output terminals 620 and 618 through the second and third mixing circuit transistors 612 and 614. In signal theory terms, the first differential information signal is multiplied with a square wave signal having the local oscillation frequency $f_{LO}$. As the spectrum of a square wave signal is comprised of components at the fundamental frequency $f_{LO}$ and uneven harmonics of $f_{LO}$, the considerations presented above with regard to the multiplication of a cos-signals still apply.

The second mixing circuit 8 is structured in a manner analogous to the first mixing circuit 6. The second mixing circuit includes a third mixing circuit input terminal 802, a fourth mixing circuit input terminal 804, a third mixing circuit output terminal 818, a fourth mixing circuit output terminal 820, a fifth mixing circuit transistor 810, a sixth mixing circuit transistor 812, a seventh mixing circuit transistor 814, and an eight mixing circuit transistor 816. The fifth to eight mixing circuit transistors are controlled by a second local oscillation signal supplied to the third and fourth local oscillation terminals 806 and 808. The connections of these circuit elements are in analogy to the connections described above with regard to the first mixing circuit 6.

The first local oscillation signal and the second local oscillation signal are in quadrature with each other. That means, that the second local oscillation signal is shifted a quarter of a wavelength, i.e., 90° with respect to the first local oscillation signal. Due to this quadrature relationship of the first and second local oscillation signals, the first differential mixing circuit output signal, present at the first and second mixing circuit output terminal 618 and 620, and the second differential mixing circuit output signal, present at the third and fourth mixing circuit output terminals 818 and 820, have a quadrature relationship. They are also referred to as the in-phase and the quadrature component of the mixed signal.

The first and second transconductors 2 and 4 are coupled to the first and second mixing circuits 6 and 8 as follows. The first transconductor output terminal 208 is coupled to the first mixing circuit input terminal 602, the second transconductor output terminal 210 is coupled to the fourth mixing circuit input terminal 804, the third transconductor output terminal 408 is coupled to the third mixing circuit input terminal 802, and the fourth transconductor output terminal 410 is coupled to the second mixing circuit input terminal 604.

The operation of the mixing stage 11 is described as follows. A differential mixer input voltage is supplied to the mixer input terminals 10 and 12. In the exemplary embodiment of FIG. 2, the mixer input signal is a voltage signal. In the first and second differential transconductors 2 and 4, the mixer input signal is converted into a differential transconductor output signal, i.e., a differential current signal. The first and second differential transconductors 2 and 4 are nominally identical, which means that the current sources 202 and 402 and the transistors 204, 206, 404, and 406 have the same current magnitudes and transfer characteristics, respectively. Accordingly, the output signal of the first differential transconductor and the output signal of the second differential transconductor are nominally identical.

However, the actual output signals of the first differential transconductor 2 and the second differential transconductor 4 are not identical. The reason for this divergence lies in the imperfections of the first and second differential transconductors 2 and 4. One of these imperfections is the inherent noise that is associated with any electronic component. The electronic noise generated in the first differential transconductor 2 is generally not correlated with the electronic noise generated in the second differential transconductor 4. However, all of the noise sources of the first differential transconductor 2 result in two noise components at the first and second transconductor output terminals 208 and 210, which are correlated. Equally, all of the noise sources of the second differential transconductor 4 result in two noise components at the third and fourth transconductor output terminals 408 and 410, which are correlated.

In other words, the total noise generated by all the individual elements of a differential transconductor results in two noise components at the differential transconductor output that are correlated to each other. Accordingly, the resulting differential output signal of each of the first and second differential transconductors 2 and 4 includes the nominal output signal, which is based on the mixer input signal, and a noise component. At the first transconductor output terminal 208, there is present a first current component from the bias current source 202, whose magnitude is determined by the mixer input signal applied to mixer input terminals 10 and 12, plus a first transconductor output noise component. Equally, at the second transconductor output terminal 210, there is present a second current component from bias current source 202, whose magnitude is determined be the mixer input signals supplied to the mixer input terminals 10 and 12, plus a second transconductor output noise component. The first and the second transconductor output noise components are correlated.

Equally, a third transconductor output noise component present at the third transconductor output terminal 408 is correlated to a fourth transconductor output noise component present at the fourth transconductor output terminal 410. Since the first transconductor output terminal and the fourth transconductor output terminal are coupled to the first mixing circuit, the first transconductor output noise component and the fourth transconductor output noise component are present in the first differential information signal, supplied to the first and second mixing circuit input terminals 602 and 604. The combination of the first and fourth transconductor output noise components is referred to as the first mixing circuit input noise component. Analogously, the second and the third transconductor output noise components are present in the second differential information signal, supplied to the third and fourth mixing circuit input terminals 802 and 804. The combination of the second and third transconductor output noise components is referred to as the second mixing circuit input noise component. Accordingly, the first mixing circuit input noise component, present at the input of the first mixing circuit and stemming from the first and second transconductors, is correlated with the second mixing circuit input noise component, present at the input of the second mixing circuit and stemming from the first and second transconductors. This correlation is achieved through the cross-coupling described above and shown in FIG. 2, although the first transconductor output noise component is not correlated with the third transconductor output noise component and the fourth transconductor output noise component, respectively, and the second transconductor output noise component is not correlated with the third transconductor output noise component and the fourth transconductor output noise component, respectively. The desired signal components of the first differential information signal and the second differential information signal are still identical, as the outputs at the first and third transconductor output terminals as well as at the second and fourth transconductor output terminals are nominally identical, respectively.

In the first mixing circuit, a portion of the first mixing circuit input noise component around the desired radio frequency $f_{RF,desired}$ as well as a portion of the first mixing circuit input noise component around the image radio frequency $f_{RF,undesired}$ are mixed into the desired intermediate frequency band. In other words, two so-called "side bands" of the first mixing circuit input noise component are translated into the intermediate frequency as a first intermediate frequency noise component. The same applies to the second mixing circuit, wherein two side bands of the second mixing circuit input noise component are translated into the second differential mixing circuit output signal as a second intermediate frequency noise component. After these mixing operations, the first intermediate frequency noise component and the second intermediate frequency noise component are still correlated.

Figure 3:
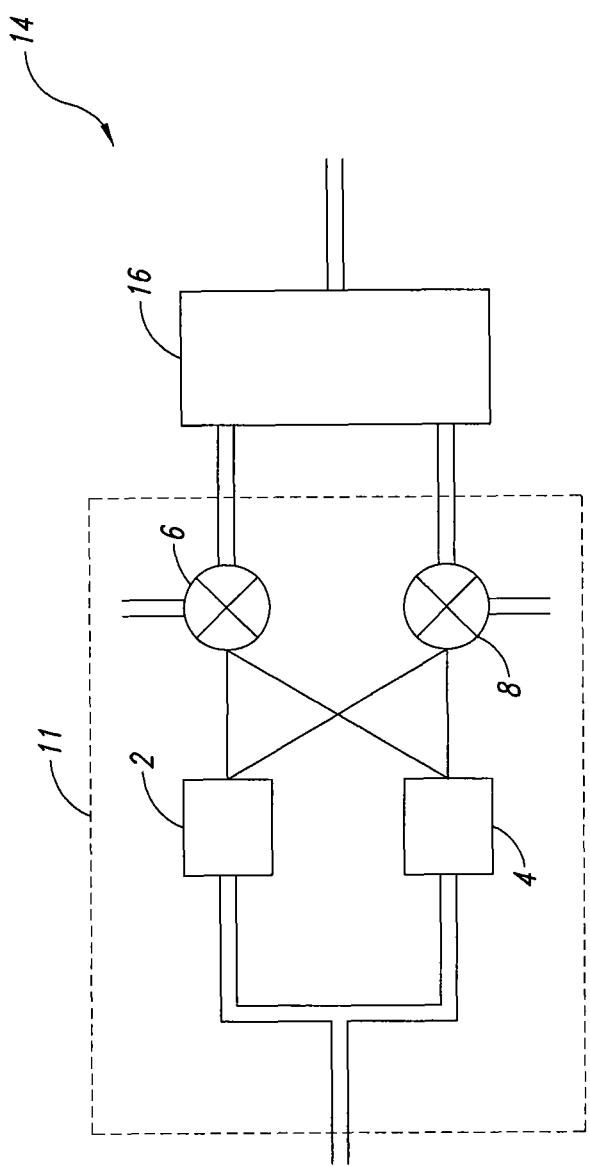
FIG. 3 shows a block diagram of an image frequency rejection mixer according to an exemplary embodiment of the present disclosure.

The further operation of the image frequency rejection mixer according to an exemplary embodiment is described with regard to FIG. 3, which shows a block diagram of the image frequency rejection mixer for illustrating the signal flow therein. FIG. 3 shows the image frequency rejection mixer 14 having the mixing stage 11 of FIG. 2 and an image rejection circuit 16. The mixing stage 11 is shown in a more abstract way than in FIG. 2, with the differential signal flow into the first and second differential transconductors 2 and 4 and out of the first and second mixing circuits 6 and 8 shown through double lines. The cross-coupling between the first and second transconductors 2 and 4 and the first and second mixing circuits 6 and 8 is illustrated through the single lines connecting the first differential transconductor 2 to the first mixing circuit 6, the first differential transconductor 2 to the second mixing circuit 8, the second differential transconductor 4 to the first mixing circuit 6, and the second differential transconductor 4 to the second mixing circuit 8.

The image rejection circuit 16 is an image rejection circuit as commonly used in image reject mixers. It is configured to filter out the nominal signal components mixed from the undesired image frequency into the intermediate frequency. For this purpose, the image rejection circuit may comprise a complex filter. In another implementation, the image rejection circuit may comprise a phase shifter and an adder. As the first and second intermediate frequency noise component are correlated due to the cross-coupling between the differential transconductors and the mixing circuits, the image rejection circuit filters out one side band of the first and second mixing circuit input noise components, respectively. This noise filtering is achieved with an image rejection circuit that is adapted to filter out the image frequency signal mixed into the intermediate frequency along with the desired radio frequency signal. It depends on the particular implementation of the image rejection circuit and the direction of phase shift between the first local oscillation signal and the second local oscillation signal, which one of the two noise side bands is filtered out by the image rejection circuit 16. As these interrelations are apparent to a person skilled in the art, according measures may be taken to choose the noise side band to be cancelled in a particular application. As is apparent from this discussion, the noise power introduced into the intermediate frequency mixer output signal due to the electronic noise of the first and second transconductors is essentially cut by 50%.

Another source of degradation of the mixer output signal is component mismatch in the transconductor sub-stage. Also in this respect, the cross-coupling of differential transconductors and mixing circuits provides for a significant increase in mixer performance. Since the effects of transconductance mismatch in the first and second transconductor output signals are shared between the first differential information signal, input into the first mixing circuit, and the second differential information signal, input into second mixing circuit, the transconductance mismatch is converted into a common mode component in each of the first and second mixing circuits. As such common mode components are not mixed in ideal Gilbert mixers, transconductance mismatch in the first and second differential transconductor does not degrade the achievable image rejection. Accordingly, the proposed mixer structure does not only significantly reduce the impact of electronic noise generated in the transconductance stage, but also eliminates the negative effect of component mismatch in the transconductance stage.

The reduction of the noise associated with the differential transconductors is highly advantageous, as it is often one of the dominant noise sources in receivers. With the proper design of bias current sources, their noise contribution can be kept much lower than the contribution of the transconductor differential pair noise. This means that the reduction of the noise associated with the transconductor differential pairs can be fully taken advantage of.

For a complex mixer input signal, an image reject mixer may have two implementations of the mixer 14, with one mixer handling the real portion of the complex mixer input signal and the other mixer handling the imaginary portion of the complex mixer input signal.

In a further embodiment, the image rejection circuit includes a complex filter. The image rejection circuit may also comprise a phase shifter and an adder. The image rejection circuit may contain only one circuit or may be comprised of a plurality of sub-circuits.

According to another embodiment, the first differential transconductor includes a first and a second transconductor output terminal, the second differential transconductor includes a third and a fourth transconductor output terminal, the first mixing circuit includes a first and a second mixing circuit input terminal, and the second mixing circuit includes a third and a fourth mixing circuit input terminal, wherein the first transconductor output terminal is coupled to the first mixing circuit input terminal, the second transconductor output terminal is coupled to the fourth mixing circuit input terminal, the third transconductor output terminal is coupled to the third mixing circuit input terminal, and the fourth transconductor output terminal is coupled to the second mixing circuit input terminal. With an according connection of the output terminals of the differential transconductor circuit to the input terminals of the mixing circuits, a cross-coupling can be achieved, which is easy to realize and allows for short connection paths in circuit implementations.

In yet another embodiment, the first differential transconductor and the second differential transconductor have nominally identical behavior, a first information signal component at the first transconductor output terminal is nominally identical to a third information signal component at the third transconductor output terminal, and a second information signal component at the second transconductor output terminal is nominally identical to a fourth information signal component at the fourth transconductor output terminal. Through the nominally identical implementation of the first and second differential transconductors, it is ensured that the cross-coupling between the differential transconductors and the mixing circuits does not result in a nominally different behavior of the mixer as compared to a non-cross-coupled implementation. Accordingly, the reduction of the noise introduction by the differential transconductors does not require any further design adaptations.

In a particular embodiment, the image reject mixer is configured to translate a desired spectral portion of the mixer input signal at a desired mixer input signal frequency to a mixer output frequency and to cancel an undesired spectral portion of the mixer input signal at an image frequency. By providing image frequency cancellation, the image reject mixer is equally adapted to cancel one of the two side bands of the electronic noise introduced into the mixer output frequency, as the noise components in the in-phase and quadrature signal paths are correlated. The desired mixer input frequency may be a radio frequency and the mixer output frequency may be an intermediate frequency.

According to an embodiment, a first mixing circuit input noise component, stemming from an inherent noise behavior of the first and second differential transconductors and present in the first differential information signal, is correlated with a second mixing circuit input noise component, stemming from the inherent noise behavior of the first and second differential transconductors and present in the second differential information signal. The first mixing circuit input noise component may comprise a first noise portion at a desired mixer input frequency and a second noise portion at an undesired image frequency, the second mixing circuit input noise component may comprise a third noise portion at the desired mixer input frequency and a fourth noise portion at the undesired image frequency, the first mixing circuit may translate the first noise portion and the second noise portion to a mixer output frequency, the second mixing circuit may translate the third noise portion and the fourth noise portion to the mixer output frequency, and the image rejection circuit may be adapted to cancel one of the first and second noise portions and to cancel one of the third and fourth noise portions. It may cancel the first and the third noise portions or the second and fourth noise portion. For these noise distributions, the image reject mixer may cancel two of the four noise portions mixed translated to the mixer output frequency.

It is apparent that the considerations above equally apply to the case of a particular frequency band around $f_{RF,desired}$ and a particular frequency band around $f_{RF,undesired}$ being translated to a particular frequency band around $f_{IF}$. Such a scenario is common, as actual signals usually have a spectral width associated with them and do not only consist of one spectral component.

Moreover, the present disclosure is not intended to be limited to particular implementations of the differential transconductors and the mixing circuits. Even though the exemplary embodiment has been shown to comprise MOSFETs, any other suitable kinds of signal processing and switching devices with and without resistive or inductive degeneration, such as bipolar transistors may be used. Also, the MOSFETs used may be p-channel or n-channel MOSFETs. The necessary adjustments of the design due to these device choices are apparent to a person skilled in the art.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

Furthermore, the features and advantages described with respect to the image rejection mixer are equally applicable to the mixing stage of the image reject mixer in accordance with the second aspect of the disclosure.

While the disclosure has been described with reference to exemplary embodiments, it will be understood by those skilled in the art that various changes may be made and equivalents may be substituted for elements thereof without departing from the scope of the disclosure. In addition, many modifications may be made to adapt to a particular situation or material to the teachings of the disclosure without departing from the essential scope thereof. Therefore it is intended that the disclosure not be limited to the particular embodiments disclosed, but that the disclosure will include all embodiments falling within the scope of the independent claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image frequency rejection mixer, comprising:
 a first differential transconductor configured to receive a differential mixer input signal;
 a second differential transconductor configured to receive the differential mixer input signal;
 a first mixing circuit configured to generate a first differential mixing circuit output signal by mixing a first differential information signal with a first local oscillation signal,
 a second mixing circuit configured to generate a second differential mixing circuit output signal by mixing a second differential information signal with a second local oscillation signal, with the first local oscillation signal and the second local oscillation signal being in quadrature; and
 an image rejection circuit configured to generate a differential mixer output signal in response to the first and second differential mixing circuit output signals,
 wherein the first and the second differential transconductors are cross-coupled to the first and second mixing circuits.

2. The image frequency rejection mixer of claim 1 wherein the image rejection circuit includes a complex filter.

3. The image frequency rejection mixer of claim 1 wherein the image rejection circuit includes a phase shifter and an adder.

4. The image frequency rejection mixer of claim 1 wherein:
 the first differential transconductor includes a first and a second transconductor output terminal;
 the second differential transconductor includes a third and a fourth transconductor output terminal;
 the first mixing circuit includes a first and a second mixing circuit input terminal; and
 the second mixing circuit includes a third and a fourth mixing circuit input terminal,
 wherein the first transconductor output terminal is coupled to the first mixing circuit input terminal, the second transconductor output terminal is coupled to the fourth mixing circuit input terminal, the third transconductor output terminal is coupled to the third mixing circuit input terminal, and the fourth transconductor output terminal is coupled to the second mixing circuit input terminal.

5. The image frequency rejection mixer of claim 4 wherein the first differential transconductor and the second differential transconductor are configured to have nominally identical behavior, the first differential transconductor is configured to generate a first information signal component at the first transconductor output terminal and a second information signal component at the second transconductor output terminal, and the second differential transconductor is configured to generate a third information signal at the third transconductor output terminal and a fourth information signal component at the fourth transconductor output terminal, the first and third information signals being nominally identical to each other, and the second and third information signals being nominally identical to each other.

6. The image frequency rejection mixer of claim 1, wherein the first and second mixing circuits are configured to translate a desired spectral portion of the differential mixer input signal from a mixer input signal frequency to a mixer output frequency and to cancel an undesired spectral portion of the differential mixer input signal at an image frequency.

7. The image frequency rejection mixer of claim 6 wherein the mixer input frequency is a radio frequency and the mixer output frequency is an intermediate frequency.

8. The image frequency rejection mixer of claim 6 wherein the first and second local oscillation signals have a local oscillation frequency, and the first and second mixing circuits are configured to generate the first and second differential mixing circuit output signals at the mixer output frequency in which the mixer output frequency is a difference of the mixer input signal frequency and the local oscillation frequency of the first and second local oscillation signals, and in which the mixer output frequency multiplied by −1 is the difference of the image frequency of the differential mixer output signal generated by the image rejection circuit and the local oscillation frequency.

9. The image frequency rejection mixer of claim 1 wherein the first and second mixing circuits are configured to correlate a first mixing circuit input noise component, stemming from an inherent noise behavior of the first and second differential transconductors and present in the first differential information signal, with a second mixing circuit input noise component, stemming from the inherent noise behavior of the first and second differential transconductors and present in the second differential information signal.

10. The image frequency rejection mixer of claim 9 wherein:
the first mixing circuit is configured to translate a first noise portion and a second noise portion in the first mixing circuit input noise component to a mixer output frequency;
the second mixing circuit is configured to translate a third noise portion and a fourth noise portion in the second mixing circuit input noise component to the mixer output frequency; and
the image rejection circuit is configured to cancel one of the first and second noise portions and to cancel one of the third and fourth noise portions.

11. A mixing stage of an image frequency rejection mixer, comprising:
a first differential transconductor configured to receive a differential mixer input signal;
a second differential transconductor configured to receive the differential mixer input signal;
a first mixing circuit configured to generate a first differential mixing circuit output signal by mixing a first differential information signal with a first local oscillation signal; and
a second mixing circuit configured to generate a second differential mixing circuit output signal by mixing a second differential information signal with a second local oscillation signal, with the first local oscillation signal and the second local oscillation signal being in quadrature,
wherein the first and the second differential transconductors are cross-coupled to the first and second mixing circuits.

12. The mixing stage of claim 11 wherein:
the first differential transconductor includes a first and a second transconductor output terminal;
the second differential transconductor includes a third and a fourth transconductor output terminal;
the first mixing circuit includes a first and a second mixing circuit input terminal; and
the second mixing circuit includes a third and a fourth mixing circuit input terminal,
wherein the first transconductor output terminal is coupled to the first mixing circuit input terminal, the second transconductor output terminal is coupled to the fourth mixing circuit input terminal, the third transconductor output terminal is coupled to the third mixing circuit input terminal, and the fourth transconductor output terminal is coupled to the second mixing circuit input terminal.

13. The mixing stage of claim 11, wherein the mixing stage is configured to be coupled to an image rejection circuit that is configured to process the first differential mixing circuit output signal and the second differential mixing circuit output signal.

14. The mixing stage of claim 11 wherein the first and second mixing circuits are configured to correlate a first mixing circuit input noise component, stemming from an inherent noise behavior of the first and second differential transconductors and present in the first differential information signal, is correlated with a second mixing circuit input noise component, stemming from the inherent noise behavior of the first and second differential transconductors and present in the second differential information signal.

15. The mixing stage of claim 14 wherein:
the first mixing circuit is configured to translate a first noise portion and a second noise portion in the first mixing input circuit noise component to a mixer output frequency; and
the second mixing circuit is configured to translate a third noise portion and a fourth noise portion in the second mixing circuit input noise component to the mixer output frequency.

16. A circuit, comprising:
a mixing stage configured to receive a differential mixer input signal, the mixing stage including:
a first mixing circuit having a first input terminal and a second input terminal and configured to generate a first differential mixing circuit output signal by mixing a first differential information signal with a first local oscillation signal; and
a second mixing circuit having a third input terminal and a fourth input terminal and configured to generate a second differential mixing circuit output signal by mixing a second differential information signal with a second local oscillation signal, with the first local oscillation signal and the second local oscillation signal being in quadrature; and
first and second differential transconductor stages that are cross-coupled to the first and second mixing circuits and configured to process the differential mixer input signal.

17. The circuit of claim 16 wherein the first differential transconductor includes a first and a second transconductor output terminal and the second differential transconductor includes a third and a fourth transconductor output terminal, and the first transconductor output terminal is coupled to the first input terminal, the second transconductor output terminal is coupled to the fourth input terminal, the third transconductor output terminal is coupled to the third input terminal, and the fourth transconductor output terminal is coupled to the second input terminal.

18. The circuit of claim 17, comprising an image rejection circuit configured to generate a differential mixer output signal from the first and second differential mixing circuit output signals.

\* \* \* \* \*